(12) United States Patent
Lecinski et al.

(10) Patent No.: US 6,373,721 B2
(45) Date of Patent: *Apr. 16, 2002

(54) CABLE MANAGEMENT APPARATUS AND METHOD

(75) Inventors: Daniel J. Lecinski; Kenneth S. Laughlin, both of Arlington Heights, IL (US)

(73) Assignee: 3Com Corporation, Rolling Meadows, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/386,111

(22) Filed: Aug. 30, 1999

(51) Int. Cl.[7] .................................................. H02B 1/20
(52) U.S. Cl. ........................ 361/826; 361/825; 361/827; 174/72 A
(58) Field of Search ................................ 361/823–827, 361/724; 174/72 A, 135

(56) References Cited

U.S. PATENT DOCUMENTS

| | | | | |
|---|---|---|---|---|
| 3,809,799 A | * | 5/1974 | Taylor | 174/72 A |
| 5,073,841 A | * | 12/1991 | DelGuidice et al. | 174/72 A |
| 5,115,377 A | * | 5/1992 | Dransman | 174/72 A |
| 5,401,193 A | * | 3/1995 | Lo Cicero et al. | 361/823 |
| 6,102,214 A | * | 8/2000 | Mendoza | 361/826 |

* cited by examiner

Primary Examiner—Jayprakash N. Gandhi
Assistant Examiner—John B. Vigushin
(74) Attorney, Agent, or Firm—Baniak Pine & Gannon

(57) ABSTRACT

A cable management apparatus includes a bracket member and a cable guide member fastened to the bracket member. The bracket member includes a stem portion and a body portion for fastening to a cabinet for housing a plurality of electronic modules. The cable guide member includes a flange portion and a shelf portion having a surface. The flange portion is angled with respect to the surface of the shelf portion to allow a plurality of cables to contact the surface of the shelf portion to route the plurality of cables within the cabinet.

20 Claims, 4 Drawing Sheets

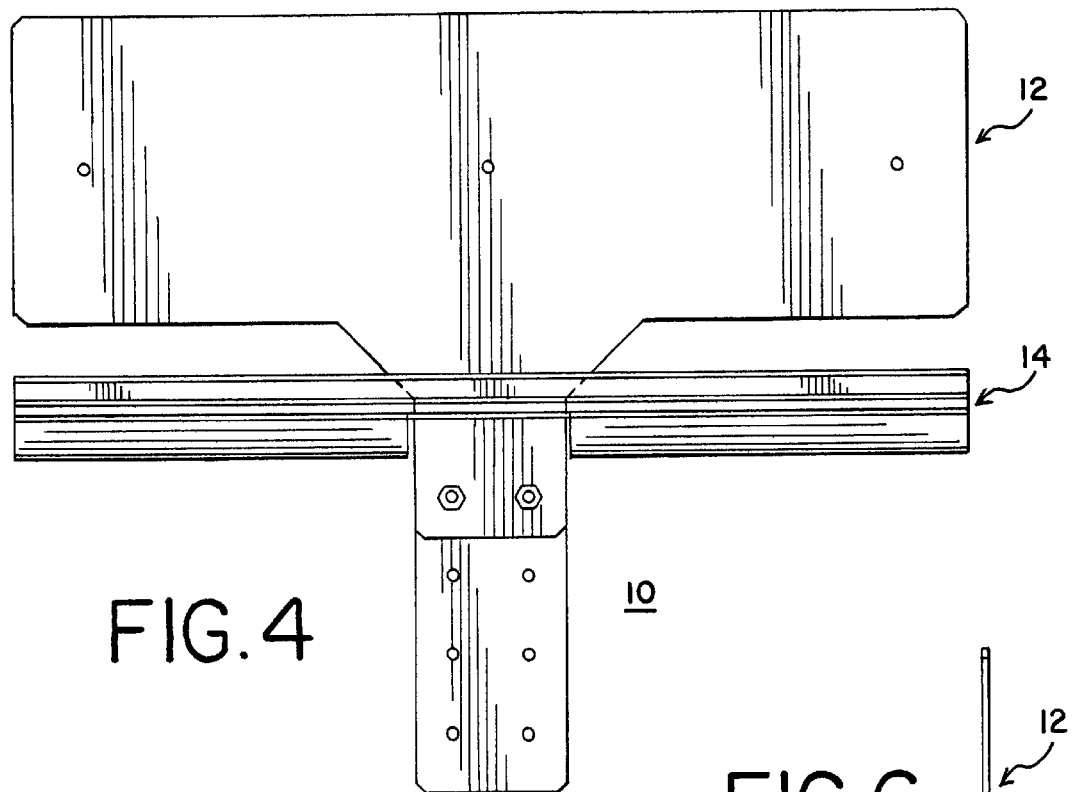
FIG. 4
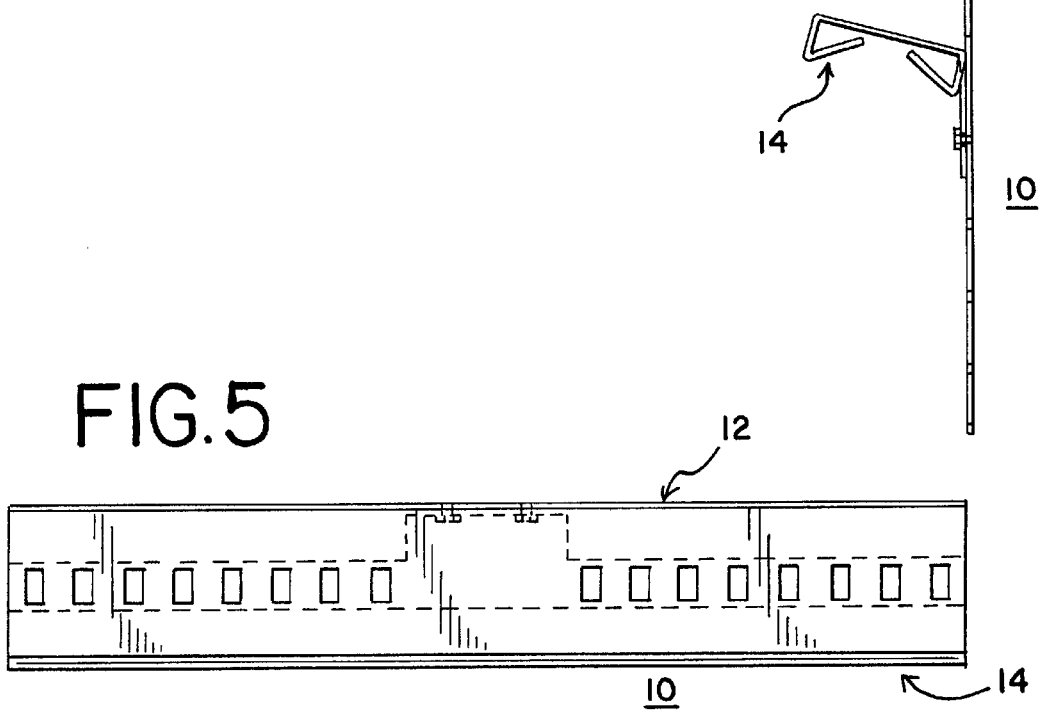
FIG. 6
FIG. 5

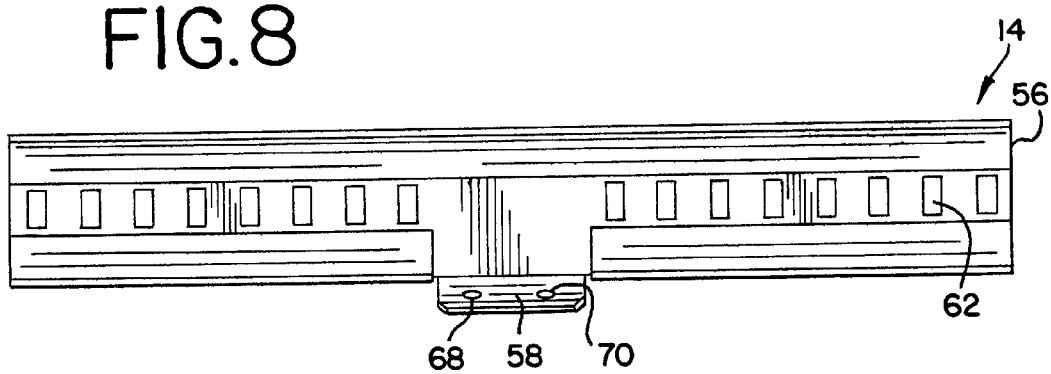
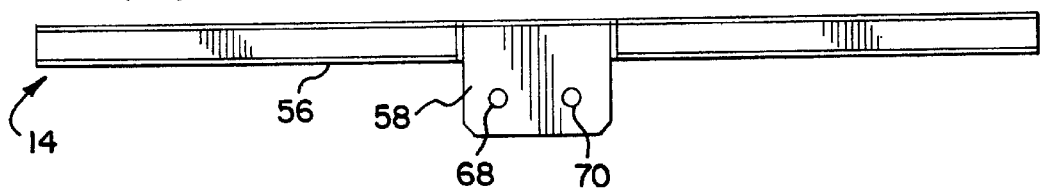
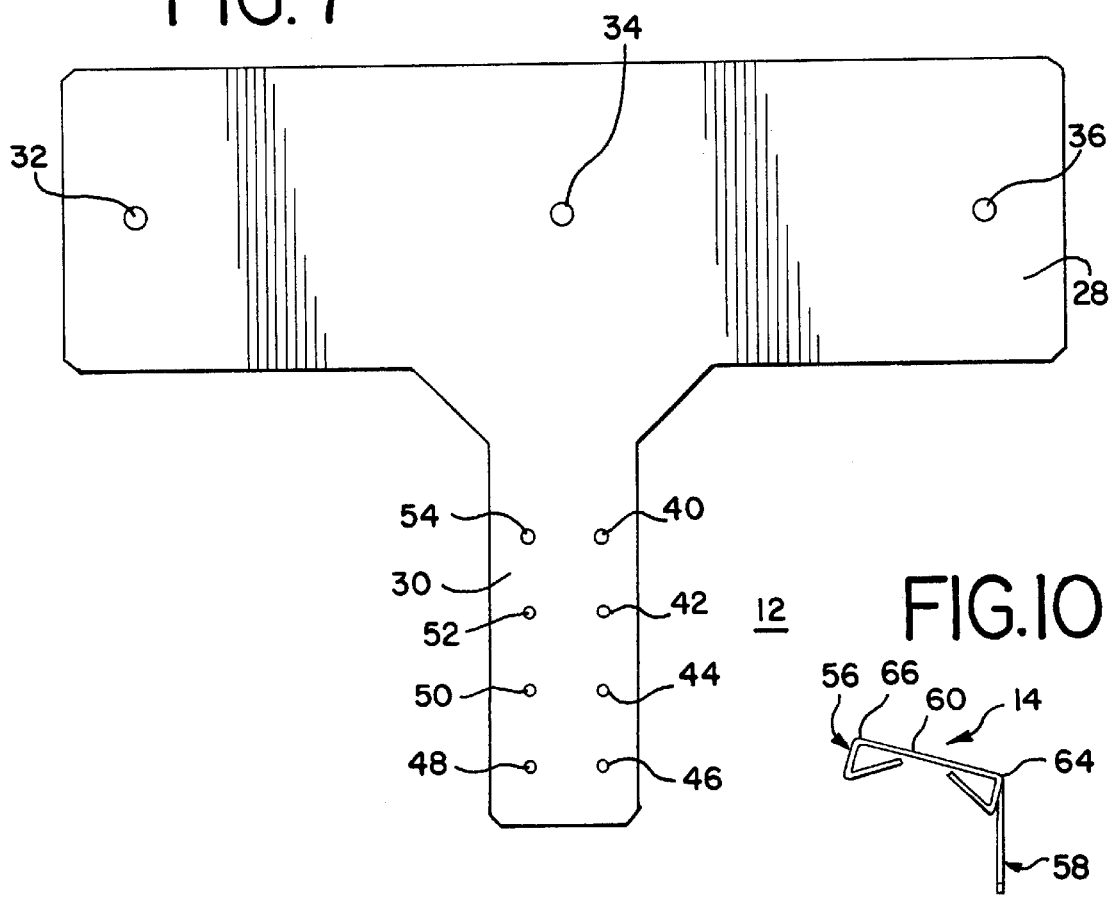
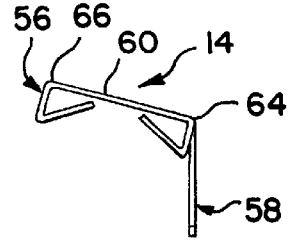

CABLE MANAGEMENT APPARATUS AND METHOD

FIELD OF THE INVENTION

This invention relates generally to a cable management apparatus for routing cables. In particular, the invention relates to a cable management apparatus which may be fastened to a cabinet for housing electronic modules to route cables within the cabinet.

BACKGROUND OF THE INVENTION

Electronic modules that house various application cards for various high speed networking functions are typically inserted into standardized racks in a vertically stacked configuration. These standardized racks typically have upright supports, each of which have spaced openings along the length of the supports. A plurality of horizontally oriented cross members is typically provided on each side of the rack to provide support for the upright supports. Brackets and conventional fasteners are typically used to secure the electronic modules to the upright supports.

Each standardized rack may house several electronic modules. Standardized racks in turn are typically housed in a cabinet having a top, bottom, and sidewalls. Conventional cabinets typically include a pair of doors positioned along the front side and the backside of the cabinet so that a technician can access the front and back end of the electronic modules within the cabinet.

Typically, a large number of cables are routed to and from each of the electronic modules within the cabinet. As a result, cable management problems arise due to the large number of cables that have to be routed within the cabinet. This problem is compounded due to the size restrictions placed on conventional electronic modules and cabinets. For example, the large number of cables within the cabinet may cause interference problems with respect to the input and output terminals of the electronic modules within the cabinet. Moreover, the large number of cables may make it difficult for a technician to identify various cables thereby making the installation and removal of cables a burdensome and time-consuming process.

In conventional cabinets, it is desirable to route cables from certain electronic modules in a horizontal fashion to the sides of the cabinet so that they do not interfere with the inputs and outputs of the other electronic modules. When the cables reach the sides of the cabinet, they are typically bent in an upward or downward direction so that they can be routed vertically along the sides of the cabinet.

Problems arise in providing a cable management solution for this arrangement. For example, cables that are directed to the sides of the cabinet may be routed through a small gap created between one of the horizontally oriented cross members of the rack and the sidewall of the cabinet. However, this typically requires that the cables be bent at an angle of 90 degrees, which may result in unacceptable bending stresses on the cables. Similarly, the bending stresses on the cables may in turn create unacceptable stresses at the connection points of the cables located at the electronic modules. Moreover, the horizontally oriented cross members are typically thin planar members that have sharp edges. As a result, routing cables over an edge of conventional cross members may damage the cables.

In addition, conventional cross members are fixedly mounted to the rack, and therefore cannot be adjusted up or down to vary the direction of the cables and account for varying cable sizes. This drawback is compounded by the fact that there are typically only a few cross members provided for a conventional rack, and they are typically spaced apart from one another. As a result, one or more of the electronic modules may be positioned within the cabinet at a location between two cross members. This may make it difficult, if not impossible, to route cables horizontally from an electronic module in a direction towards the sidewall of the cabinet and route the cables between a cross member and the sidewall.

Accordingly, it would be desirable to have a cable management apparatus that overcomes the disadvantages described above, and to provide a simple and cost effective cable management apparatus.

SUMMARY OF THE INVENTION

One aspect of the invention provides a cable management apparatus including a bracket member and a cable guide member fastened to the bracket member. The bracket member includes a body portion for fastening to a cabinet for housing a plurality of electronic modules. The bracket member further includes a stem portion. The cable guide member includes a shelf portion having a surface and a flange portion. The flange portion is angled with respect to the surface of the shelf portion to allow a plurality of cables to contact the surface of the shelf portion to route the plurality of cables within the cabinet. The body portion may preferably include a plurality of body portion openings to allow the body portion to be fastened to the cabinet. The flange portion may preferably be fastened to the stem portion. The stem portion may preferably include a plurality of stem portion openings to allow the cable guide member to be fastened to the stem portion. The flange portion may preferably include at least one flange portion opening to allow the flange portion of the cable guide member to be fastened to the stem portion of the bracket member. The at least one flange portion opening may preferably include two flange portion openings. The shelf portion may preferably include a plurality of shelf portion openings spaced along the shelf portion for receiving cable ties to secure the plurality of cables to the surface of the shelf portion. The flange portion may preferably be angled with respect to the surface of the shelf portion more than 90 degrees. The body portion and the stem portion may each preferably have a generally rectangular shape. The stem portion may preferably extend outward perpendicular from the body portion. The bracket member may preferably be a planar member. The body portion may preferably include a length and the shelf portion may preferably include a length. The length of the body portion may preferably be equal to the length of the shelf portion. The shelf portion may preferably include at least one curved edge portion. The at least one curved edge portion may preferably be comprised of two curved edge portions.

Another aspect of the invention provides a cable management apparatus including a cabinet for housing a plurality of electronic modules. A bracket member is fastened to the cabinet, and a cable guide member is fastened to the bracket member. The bracket member includes a body portion fastened to the cabinet. The bracket member further includes a stem portion. The cable guide member includes a shelf portion having a surface and a flange portion. The flange portion is angled with respect to the surface of the shelf portion to allow a plurality of cables to contact the surface of the shelf portion to route the plurality of cables within the cabinet. The cabinet may preferably include a sidewall, and the bracket member may preferably be fastened to the sidewall. A brace member may preferably extend along the sidewall, and the bracket member may preferably be fastened to the brace member.

Another aspect of the invention provides a method of routing a plurality of cables within a cabinet for housing a plurality of electronic modules. A bracket member and a cable guide member are provided. The bracket member includes a body portion and a stem portion. The cable guide member includes a shelf portion having a surface and a flange portion. The flange portion is angled with respect to the surface of the shelf portion. The cable guide member is fastened to the bracket member. The body portion of the bracket member is fastened to a cabinet for housing a plurality of electronic modules. A plurality of cables contacts with the surface of the shelf portion. The plurality of cables is routed within the cabinet.

Another aspect of the invention provides a method of routing cables. A cabinet for housing a plurality of electronic modules is provided. A bracket member and a cable guide member are also provided. The bracket member includes a body portion and a stem portion. The cable guide member includes a shelf portion having a surface and a flange portion. The shelf portion further includes a plurality of shelf portion openings spaced along the shelf portion. The flange portion is angled with respect to the surface of the shelf portion. The bracket member is fastened to the cabinet. The cable guide member is fastened to the bracket member. The body portion of bracket member is fastened to the cabinet. A plurality of cables contacts with the surface of the shelf portion. The plurality of cables is routed within the cabinet and the plurality of cables is secured to the surface of the shelf portion.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE DRAWINGS

FIG. 4 is an enlarged front view of the embodiment of FIG. 1;

FIG. 5 is a top view of the embodiment of FIG. 4;

FIG. 6 is a side view of the embodiment of FIG. 4;

FIG. 7 is a front view of the bracket member of FIG. 1;

FIG. 8 is a bottom view of the cable guide member of FIG. 1;

FIG. 9 is a rear view of the cable guide member of FIG. 1; and

FIG. 10 is a side view of the cable guide member of FIG. 1.

DETAILED DESCRIPTION OF THE PRESENTLY PREFERRED EMBODIMENTS

Figure 1:
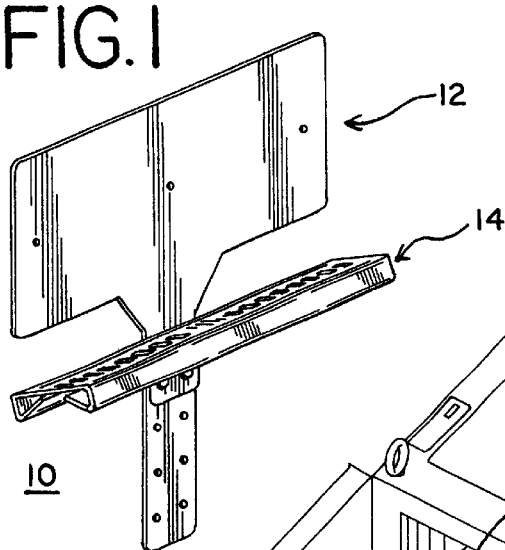
FIG. 1 is a perspective view of a preferred embodiment of a cable management apparatus that is made in accordance with the invention.
Figure 2:
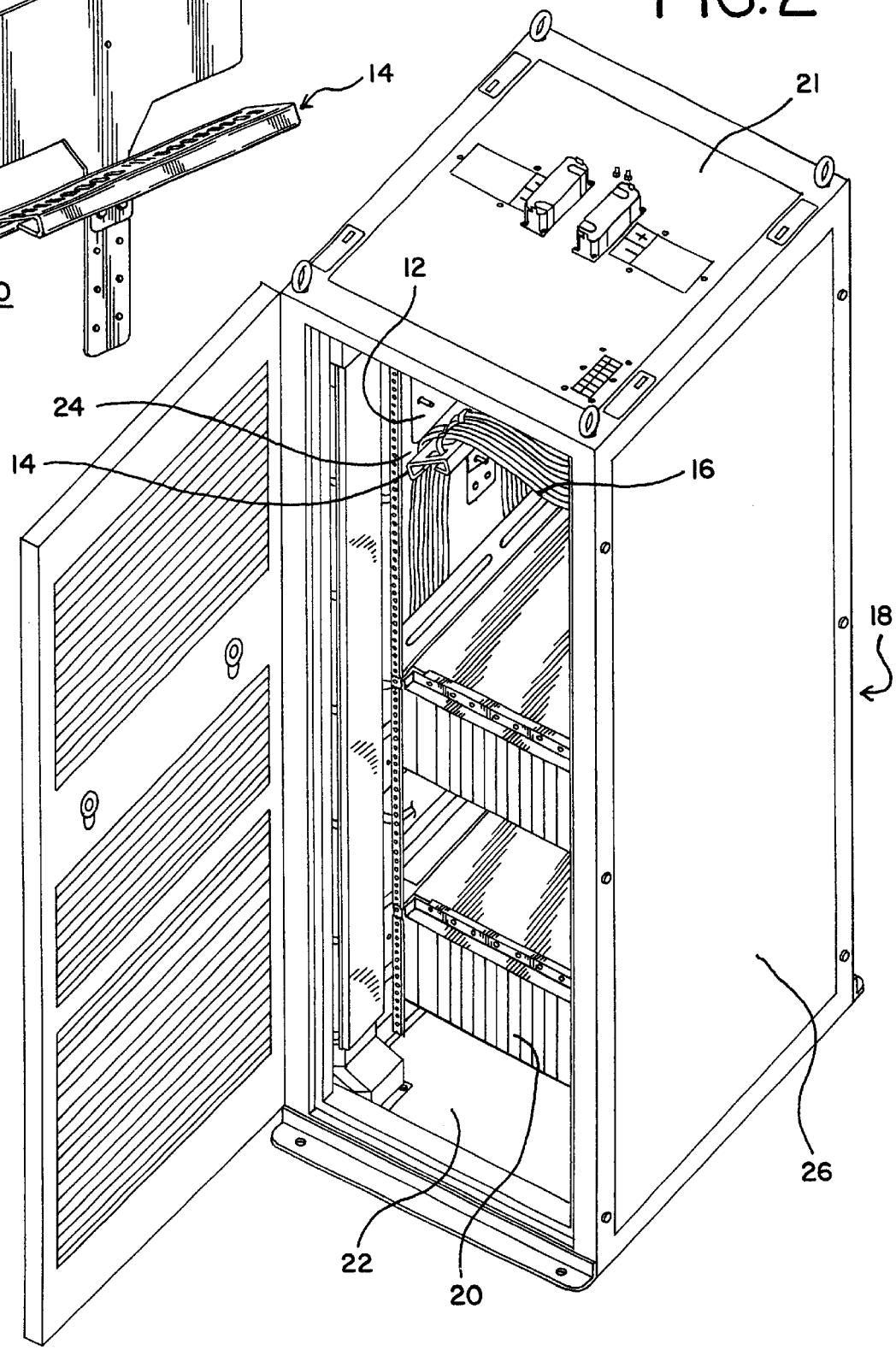
FIG. 2 is a perspective view showing the cable management apparatus of FIG. 1 fastened to a cabinet for housing a plurality of electronic modules.
Figure 3:
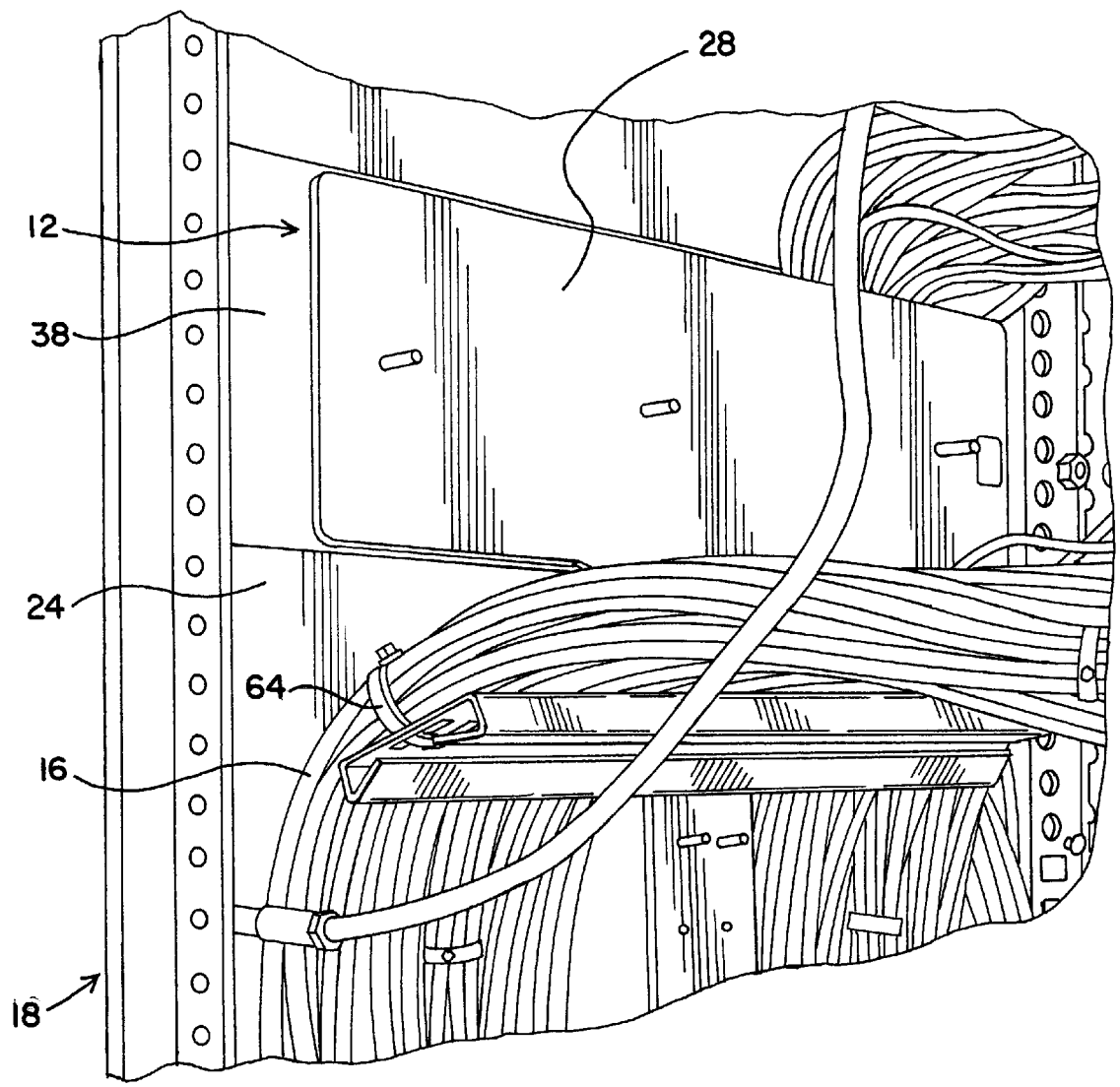
FIG. 3 is an enlarged partial view of the embodiment of FIG. 2.

Referring to FIGS. 1 and 4–6, a preferred embodiment of a cable management apparatus 10 includes a bracket member 12 and a cable guide member 14 fastened to the bracket member 12. As shown in FIGS. 2–3, the cable management apparatus 10 is used for routing a plurality of cables 16 in a cabinet 18 for housing a plurality of electronic modules 20. The cabinet 18 may preferably be any conventional cabinet for housing a plurality of electronic modules 20. For example, the cabinet 18 may preferably be adapted to house various electronic modules used to carry out various networking applications. The cabinet 18 may preferably be rectangular in shape, and may preferably include a top wall 21, a bottom wall 22, a first sidewall 24 and a second sidewall 26. The electronic modules 20 may preferably be any type of electronic devices including, for example, an office router, a port expansion device, a managed modem pool device, an access concentrator, a redundant power device, a LAN switch, an edge server, and other various types of conventional electronic devices.

Referring to FIG. 7, the bracket member 12 includes a body portion 28 and a stem portion 30. As shown in FIGS. 2–3, the bracket member 12 is fastened to the cabinet 18 and provides a structure to which the cable guide member 14 can be fastened. The bracket member 12 may be easily and quickly fastened to the cabinet 18 with any conventional fastener, such as screws, bolts, or rivets. Referring again to FIG. 7, the bracket member 12 may preferably be a thin planar member, although other shapes and configurations are contemplated. The body portion 28 of the bracket member 12 may preferably include a plurality of body portion openings 32, 34, 36 to allow the body portion 28 to be fastened to the cabinet 18. As shown in FIG. 7, the body portion 28 may preferably have a generally rectangular shape. Alternatively, the body portion 28 may have other shapes and configurations depending upon the particular application.

As shown in FIG. 3, the bracket member 12 may preferably be fastened to the sidewall 24 of the cabinet 18. The sidewall 24 of the cabinet 18 may preferably include a horizontally oriented brace member 38 that extends along the sidewall 24 of the cabinet 18 from the front of the cabinet 18 to the back of the cabinet 18. As shown in FIG. 3, the bracket member 28 may preferably be fastened to the horizontally oriented brace member 38.

Referring again to FIG. 7, the stem portion 30 of the bracket member 12 may preferably include a plurality of stem portion openings 40, 42, 44, 46, 48, 50, 52, 54 to allow the cable guide member 14 to be fastened to the stem portion 30. Any conventional fastener, such as screws, bolts, or rivets may be used to fasten the cable guide member 14 to the stem portion 30. As shown in the embodiment of FIG. 7, the plurality of stem portion openings 40, 42, 44, 46, 48, 50, 52, and 54 may be arranged in two vertical columns each positioned along the length of the stem portion 30. The openings of the first column may be aligned horizontally with the openings of the second column. The advantage of this arrangement is that position of the cable guide member 14 can be easily adjusted relative to the bracket member 12. Having an adjustable cable guide member 14 allows a technician to adjust the position of the plurality of cables 16 within the cabinet 18, and allows a wide range of sizes of cables or bundles of cables to be routed within the cabinet 18.

As shown in FIG. 7, the stem portion 30 of the bracket member 12 may preferably have a generally rectangular shape, although other shapes and configurations are contemplated. In the embodiment shown, the stem portion 30 extends outward perpendicular from the body portion 28.

Referring to FIGS. 8–10, the cable guide member 14 includes a shelf portion 56 and a flange portion 58. The shelf portion 56 includes a surface 60 (see FIG. 10) onto which the plurality cables 16 are positioned. The shelf portion 56 may preferably include a plurality of shelf portion openings 62 (see FIG. 8) spaced along the length of the shelf portion 56. Referring to FIG. 3, the plurality of shelf portion openings 62 may preferably receive cable ties 64 to secure the plurality of cables 16 to the surface 60 of the shelf portion 56. The cable guide member 14 minimizes movement of the plurality of cables 16, which is particularly important during seismic activity which may cause movement of the entire cabinet 18.

Referring to FIG. 10, the flange portion 58 of the cable guide member 14 is angled with respect to the surface 60 of the shelf portion 56. In the embodiment shown, for example, the flange portion 58 may preferably be angled with respect to the surface 60 of the shelf portion 56 more than 90 degrees. The advantage of angling the flange portion 58 with respect to the shelf portion 56 is that it provides strain relief for the plurality of cables 16 and ensures that the maximum bend radius for the plurality of cables 16 is not exceeded. In addition, this arrangement reduces stresses at the connection points of the plurality of cables 16. Finally, the angled flange portion 58 facilitates the guiding of the plurality of cables 16 in a predetermined direction along a desired path.

Referring again to FIG. 10, the shelf portion 56 may also preferably include a first curved edge portion 64 and second curved edge portion 66. The first and second curved edge portions 64, 66 prevent the plurality of cables 16 from being damaged as they are routed over the surface 60 of the shelf portion 56.

Referring to FIGS. 8–9, the flange portion 58 may preferably include at least one flange portion opening 68 to allow the flange portion 58 of the cable guide member 14 to be fastened to the stem portion 30 of the bracket member 12. A second flange portion opening 70 may also be provided. The number of flange portion openings may vary depending upon the particular application.

As shown in FIGS. 7–8, the body portion 28 of the bracket member 12 includes a length (L) and the shelf portion 56 of the cable guide member 14 includes a length (LL). The length (L) of the body portion 28 may preferably be equal to the length (LL) of the shelf portion 56. Alternatively, other configurations are contemplated.

The apparatus shown in FIGS. 1–10 may be used for routing a plurality of cables 16 within a cabinet 18 for housing a plurality of electronic modules 20. The cable guide member 14 is fastened to the bracket member 12, and the body portion 28 of the bracket member 12 is fastened to the cabinet 18. A plurality of cables 16 contacts with the surface 60 of the shelf portion 56, and the plurality of cables 16 are routed within the cabinet 18. The plurality of cables 16 may preferably be secured to the surface 60 of the shelf portion 56 with a plurality of cable ties 64.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A cable management apparatus comprising:
a bracket member and an adjustable cable guide member fastened to the bracket member, the bracket member and the adjustable cable guide member defining a passageway having a dimension for routing a plurality of cables, the adjustable cable guide member being adjustable in a vertical direction relative to the bracket member to allow the dimension of the passageway to be varied, the bracket member including a body portion for fastening to a cabinet, the bracket member further including a stem portion, the adjustable cable guide member including a shelf portion and a flange portion, the shelf portion including a contact surface for contacting and supporting the plurality of cables, the flange portion angled with respect to the contact surface of the shelf portion to allow the plurality of cables to contact the contact surface of the shelf portion when the plurality of cables is routed through the passageway.

2. The apparatus of claim 1 wherein the body portion includes a plurality of body portion openings to allow the body portion to be fastened to the cabinet.

3. The apparatus of claim 1 wherein the flange portion is fastened to the stem portion.

4. The apparatus of claim 1 wherein the stem portion includes a plurality of stem portion openings to allow the cable guide member to be fastened to the stem portion.

5. The apparatus of claim 1 wherein the flange portion includes at least one flange portion opening to allow the flange portion of the cable guide member to be fastened to the stem portion of the bracket member.

6. The apparatus of claim 5 wherein the at least one flange portion opening comprises two flange portion openings.

7. The apparatus of claim 1 wherein the shelf portion includes a plurality of shelf portion openings spaced along the shelf portion for receiving cable ties to secure the plurality of cables to the surface of the shelf portion.

8. The apparatus of claim 1 wherein the flange portion is angled with respect to the surface of the shelf portion more than 90 degrees.

9. The apparatus of claim 1 wherein the body potion has a generally rectangular shape.

10. The apparatus of claim 1 wherein the stem portion has a generally rectangular shape.

11. The apparatus of claim 1 wherein the stem portion extends outward perpendicular from the body portion.

12. The apparatus of claim 1 wherein the bracket member is a planar member.

13. The apparatus of claim 1 wherein the body portion includes a length and the shelf portion includes a length, the length of the body portion being equal to the length of the shelf portion.

14. The apparatus of claim 1 wherein the shelf portion includes at least one curved edge portion.

15. The apparatus of claim 14 wherein the at least one curved edge portion comprises two curved edge portions.

16. A cable management apparatus comprising:
a cabinet for housing a plurality of electronic modules, a bracket member fastened to a side wall of the cabinet, and an adjustable cable guide member fastened to the bracket member, the bracket member and the adjustable cable guide member defining a passageway having a dimension through which a plurality of cables is routed, the adjustable cable guide member being adjustable in a vertical direction relative to the bracket member to allow the dimension of the passageway to be varied, the bracket member including a body portion fastened to the side wall of the cabinet, the bracket member further including a stem portion, the adjustable cable guide member including a shelf portion and a flange portion, the shelf portion including a contact surface for contacting and supporting the plurality of cables, the flange portion angled with respect to the contact surface of the shelf portion to allow the plurality of cables to contact the contact surface of the shelf portion when the plurality of cables is routed through the passageway within the cabinet.

17. The apparatus of claim 16 wherein the cabinet includes a sidewall, the bracket member fastened to the sidewall.

18. The apparatus of claim 17 further comprising a brace member extending along the sidewall, the bracket member fastened to the brace member.

19. A method of routing a plurality of cables within a cabinet for housing a plurality of electronic modules comprising:

providing a bracket member and an adjustable cable guide member, the bracket member and the adjustable cable guide member defining a passageway having a dimension, the adjustable cable guide member being adjustable in a vertical direction relative to the bracket member to allow the dimension of the passageway to be varied, the bracket member including a body portion and a stem portion, the adjustable cable guide member including a shelf portion and a flange portion, the shelf portion including a contact surface, the flange portion angled with respect to the contact surface of the shelf portion;

fastening the cable guide member to the bracket member;

fastening the body portion of the bracket member to the cabinet;

routing the plurality of cables through the passageway;

contacting the plurality of cables with the contact surface of the shelf portion;

supporting the plurality of cables with the contact surface; and routing the plurality of cables within the cabinet.

20. A method of routing a plurality of cables within a cabinet for housing a plurality of electronic modules comprising:

providing a bracket member, and an adjustable cable guide member, the bracket member and the adjustable cable guide member defining a passageway having a dimension, the adjustable cable guide member being adjustable in a vertical direction relative to the bracket member to allow the dimension of the passageway to be varied, the bracket member including a body portion, the bracket member further including a stem portion, the adjustable cable guide member including a shelf portion and a flange portion, the shelf portion including a contact surface, the shelf portion further including a plurality of shelf portion openings spaced along the shelf portion, the flange portion angled with respect to the contact surface of the shelf portion;

fastening the bracket member to a side wall of the cabinet;

fastening the cable guide member to the bracket member;

fastening the body portion of bracket member to the side wall of the cabinet;

routing the plurality of cables through the passageway;

contacting a plurality of cables with the contact surface of the shelf portion;

routing the plurality of cables within the cabinet; and securing the plurality of cables to the contact surface of the shelf portion.

* * * * *